(12) United States Patent
Ko et al.

(10) Patent No.: US 10,354,873 B2
(45) Date of Patent: Jul. 16, 2019

(54) ORGANIC MANDREL PROTECTION PROCESS

(71) Applicant: Tokyo Electron Limited, Minato-ku, Tokyo (JP)

(72) Inventors: Akiteru Ko, Schenectady, NY (US); Angelique Raley, Halfmoon, NY (US); Sophie Thibaut, Troy, NV (US); Satoru Nakamura, Albany, NY (US); Nihar Mohanty, Clifton Park, NY (US)

(73) Assignee: Tokyo Electron Limited, Tokyo (JP)

( * ) Notice: Subject to any disclaimer, the term of this patent is extended or adjusted under 35 U.S.C. 154(b) by 150 days.

(21) Appl. No.: 15/491,432

(22) Filed: Apr. 19, 2017

(65) Prior Publication Data

US 2017/0358450 A1 Dec. 14, 2017

Related U.S. Application Data

(60) Provisional application No. 62/373,500, filed on Aug. 11, 2016, provisional application No. 62/347,460, filed on Jun. 8, 2016.

(51) Int. Cl.
*H01L 21/033* (2006.01)
*H01L 21/02* (2006.01)
(Continued)

(52) U.S. Cl.
CPC ...... *H01L 21/0337* (2013.01); *H01L 21/0228* (2013.01); *H01L 21/0276* (2013.01);
(Continued)

(58) Field of Classification Search
CPC ......... H01L 21/31144; H01L 21/31116; H01L 21/0332; H01L 21/0334; H01L 21/02271;
(Continued)

(56) References Cited

U.S. PATENT DOCUMENTS

2008/0311753 A1 12/2008 Zheng et al.
2010/0227276 A1* 9/2010 Mizuno ............... C23C 16/402
430/312
(Continued)

FOREIGN PATENT DOCUMENTS

WO 2015100364 A1 7/2015

OTHER PUBLICATIONS

Taiwan Intellectual Property Office, Office Action issued in corresponding TW Patent Application No. 106117511 dated Jun. 29, 2018, 7 pp., including English translation.
(Continued)

*Primary Examiner* — Mohammad R Alam
(74) *Attorney, Agent, or Firm* — Wood Herron & Evans LLP

(57) ABSTRACT

Provided is a method of patterning spacers, the method comprising: providing an initial patterned structure in a substrate in a processing chamber, the initial patterned structure comprising an organic mandrel and an underlying layer; exposing the patterned structure in a direct current superposition (DCS) plasma treatment process, the process depositing a layer of a first material on the initial patterned structure; performing an atomic layer conformal deposition process using a second material, the first material providing protection to the organic mandrel at the beginning of the atomic layer conformal deposition process; performing a spacer etch mandrel pull process, the process creating a final patterned structure with a target final sidewall angle; concurrently controlling integration operating variables in the DCS plasma treatment process, the atomic layer conformal deposition process, and the spacer etch mandrel pull process in order to meet the target final sidewall angle and other integration objectives.

20 Claims, 15 Drawing Sheets

(51) Int. Cl.
  *H01L 21/027* (2006.01)
  *H01L 21/311* (2006.01)
  *H01L 21/66* (2006.01)

(52) U.S. Cl.
  CPC .. *H01L 21/02164* (2013.01); *H01L 21/02274* (2013.01); *H01L 21/0332* (2013.01); *H01L 21/0335* (2013.01); *H01L 21/31116* (2013.01); *H01L 21/31138* (2013.01); *H01L 22/12* (2013.01); *H01L 22/20* (2013.01); *H01L 22/26* (2013.01)

(58) Field of Classification Search
  CPC ........... H01L 21/3086; H01L 21/28141; H01L 21/0337; H01L 21/28132; H01L 21/283; H01L 21/02211; H01L 21/02164; H01J 37/32366
  See application file for complete search history.

(56) References Cited

U.S. PATENT DOCUMENTS

| | | |
|---|---|---|
| 2014/0248773 A1 | 9/2014 | Tsai |
| 2015/0056810 A1 | 2/2015 | Nair et al. |
| 2015/0072527 A1 | 3/2015 | Ng et al. |
| 2015/0160557 A1* | 6/2015 | deVilliers ............. G03F 7/2024 430/323 |
| 2015/0268164 A1 | 9/2015 | Amir |
| 2015/0287612 A1 | 10/2015 | Luere et al. |
| 2016/0049314 A1 | 2/2016 | Nakahara |

OTHER PUBLICATIONS

International Searching Authority, International Search Report and Written Opinion issued in corresponding International Patent Application No. PCT/US2017/033242 dated Aug. 29, 2017, 14 pp.

* cited by examiner

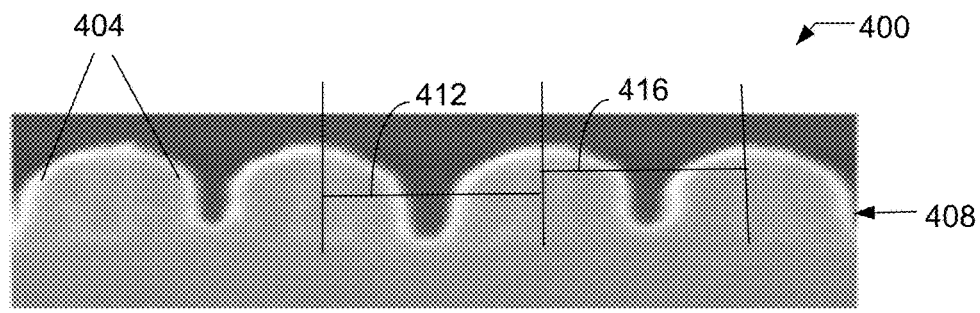
*FIG. 4 Prior Art*
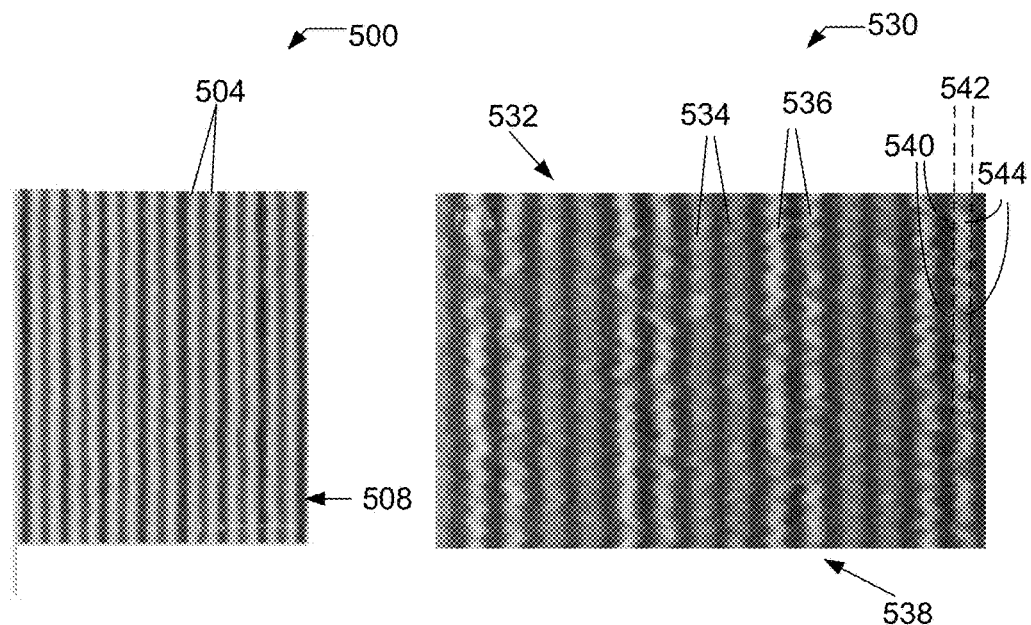
*FIG. 5A Prior Art*   *FIG. 5B Prior Art*

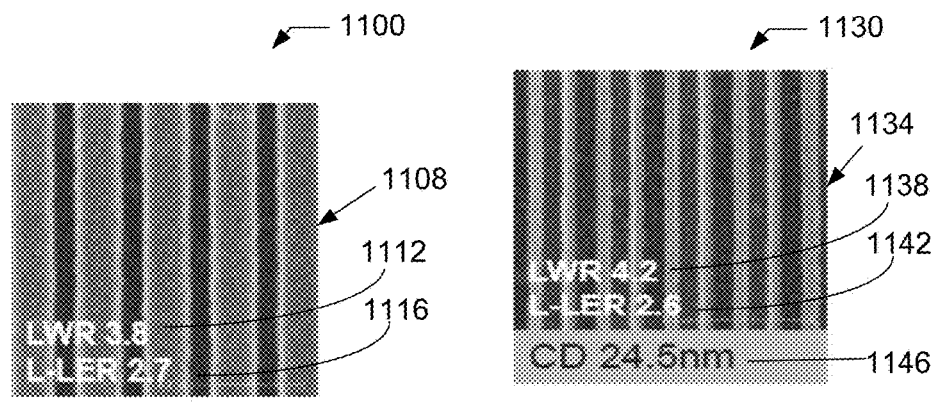
FIG. 11A  FIG. 11B
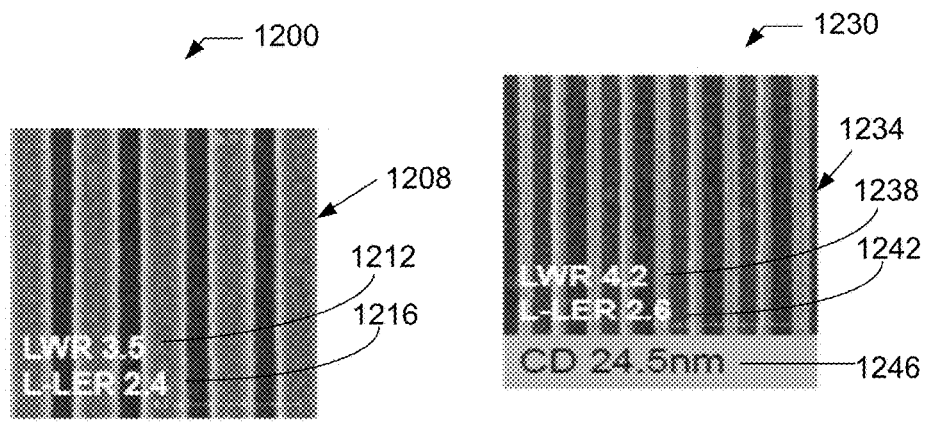
FIG. 12A  FIG. 12B

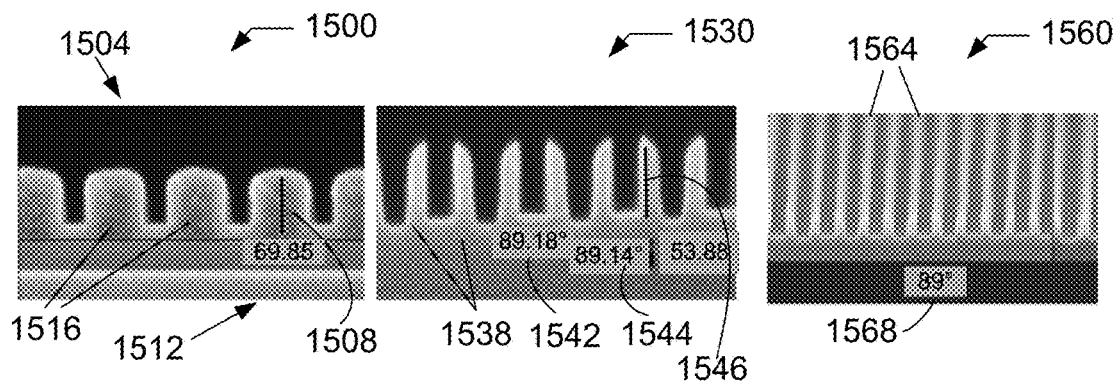
FIG. 15A   FIG. 15B   FIG. 15C
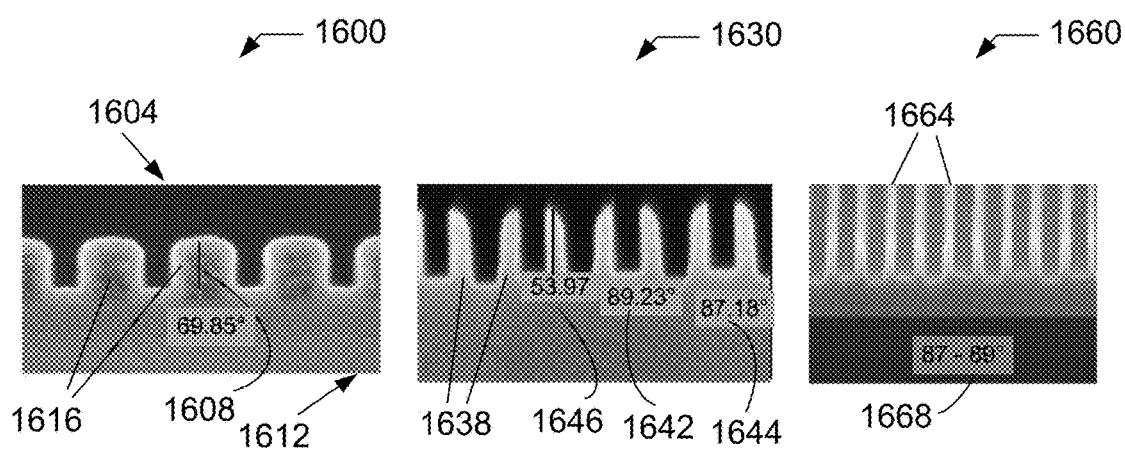
FIG. 16A   FIG. 16B   FIG. 16C

ORGANIC MANDREL PROTECTION PROCESS

CROSS-REFERENCE TO RELATED APPLICATIONS

Pursuant to 37 C.F.R. § 1.78(a)(4), this application claims the benefit of and priority to U.S. Provisional Application No. 62/347,460, filed Jun. 8, 2016, and U.S. Provisional Application No. 62/373,500, filed Aug. 11, 2016, which is expressly incorporated by reference herein in its entirety.

BACKGROUND OF THE INVENTION

Field of Invention

The present invention relates to systems and methods for substrate processing, and more particularly to a method and system for enhancing fidelity of pattern transfer and reducing leaning and edge placement errors of a patterned structure.

Description of Related Art

This invention relates to multi-patterning schemes which utilize a spacer. Multi-patterning is used in both the front end of the line and the back end of the line to target pitches that are not available through conventional 193 immersion lithography alone. Several multi-patterning schemes can be used to target the required pitch. Due to the high cost involved with multi-patterning, efforts have been made to reduce costs by using lesser steps or by using organic mandrels instead of hard mandrels. In addition, organic mandrels are widely used in multi-patterning due to their ease of integration. Typically, the first organic mandrel will be patterned through a plasma etch process before moving to a first conformal atomic layer deposition (ALD). In most cases, the first spacer deposited on the organic mandrel in an integration scheme is a room-temperature plasma enhanced ALD (PEALD) using oxide through plasma assisted deposition tool. The reason for this is that PEALD oxide can be easily deposited at room temperature and thus will not cause the deterioration of organic materials such as resist, an organic planarizing layer (OPL), an advanced pattern film (APF), or a spin-on hardmask (SOH). Other ALD films can also be used assuming these meet the temperature requirements to enable compatibility with organic film materials.

During the oxide PEALD film deposition process, an oxygen-containing plasma is used which impacts the mandrel shape by removing some of the top mandrel material. This oxygen-containing plasma only impacts the mandrel during the very beginning of the deposition process. Once the organic mandrel is covered by at least one layer, the mandrel is protected and will normally retain its shape from that point onward. However, the initial top mandrel material loss leads to a mandrel pattern that is no longer rectangular, i.e., with a perfect square top but to a trapezoidal shape with the top of the mandrel being smaller than the bottom of the mandrel. This trapezoidal shape also leads to leaning spacers being deposited which negatively affect pattern fidelity and edge placement in downstream integration steps. This is especially the case in integration schemes that utilize the first spacer as a second mandrel for one or more subsequent pitch splitting process. In addition to the leaning of the spacer, the thickness of the spacer is also affected by the material loss due to the initial plasma effect during ALD and additional processing during spacer etch mandrel pull (SEMP). The leaning of the spacer and the reduction of the thickness can result in increased line width roughness, line edge roughness, and edge placement error issues. Further pitch splitting can amplify the leaning of the spacer and damage to the spacers, resulting in fidelity transfer and roughness problems.

There is a need for preventing the initial cause of the damage to the patterned structure that starts the leaning progression for the spacers. Furthermore, there is also a need for reducing the effect of the damage to the patterned structure in subsequent steps of the integration scheme where remedial action can prevent propagation of the spacer leaning in subsequent deposition and spacer etch mandrel pull operations. There is a need for determining the ranges of and controlling operating variables in order to preserve fidelity of the transfer process and controlling roughness and edge placement error of the final patterned structure.

SUMMARY OF THE INVENTION

Provided is a method of patterning spacers in a multi-patterning scheme, the method comprising: providing an initial patterned structure in a substrate in a processing chamber, the initial patterned structure comprising an organic mandrel and an underlying layer; exposing the initial patterned structure in a direct current superposition (DCS) plasma treatment process, the DCS plasma treatment process depositing a layer of a first material on the initial patterned structure; performing an atomic layer conformal deposition process using a second material, the first material providing protection to the organic mandrel at the beginning of the atomic layer conformal deposition process; performing a spacer etch mandrel pull (SEMP) process, the SEMP process creating a final patterned structure with a target final sidewall angle; concurrently controlling integration operating variables in the DCS plasma treatment process, the atomic layer conformal deposition process, and the SEMP process in order to meet the target final sidewall angle and other integration objectives.

BRIEF DESCRIPTION OF THE DRAWINGS

The accompanying drawings, which are incorporated in and constitute a part of this specification, illustrate embodiments of the invention and, together with the general description of the invention given above, and the detailed description given below, serve to describe the invention.

FIG. 1A is a prior art schematic diagram illustrating a trapezoidal spacer pattern in a substrate prior to a plasma enhanced atomic layer deposition (PEALD) process while

FIG. 4 is a prior art image illustrating edge placement error (EPE) issues due to rounding and leaning of the spacers during previous deposition and etch cycles.

FIG. 5A is a prior art top-view image of a substrate illustrating a defined line and space pattern after a first spacer pull process whereas FIG. 5B is a prior art image illustrating different shapes and height of masks due to plasma faceting, sputtering of spacers, and related EPE issues.

FIG. 9A and FIG. 9B, FIG. 10A and FIG. 10B, FIG. 11A and FIG. 11B, and FIG. 12A and FIG. 12B are paired images that highlight results such as LWR, L-LER, and CD when the processing time, power, and pressure used in the DCS step are varied.

FIG. 8A is a top-view image of the substrate when no DCS is performed, highlighting the line width roughness (LWR) and left-line edge roughness (L-LER) post spacer deposition. FIG. 8B is a top-view image of the substrate when no DCS was performed highlighting the LWR and L-LER post spacer etch mandrel pull (SEMP).

FIG. 9A is a top-view image of the substrate illustrating the LWR and L-LER post spacer deposition using a 10-second DCS process. FIG. 9B is a top-view image of the substrate illustrating the LWR and L-LER post SEMP using a 10-second DCS process.

FIG. 10A is a top-view image of the substrate illustrating the LWR and L-LER post spacer deposition using a 20-second DCS process. FIG. 10B is a top-view image of the substrate illustrating the LWR and L-LER post SEMP using a 20-second DCS process.

FIG. 11A is a top-view image of the substrate illustrating the LWR and L-LER post spacer deposition using a 10-second 600V DCS process. FIG. 11B is a top-view image of the substrate illustrating the LWR and L-LER post SEMP using a 10-second 600V DCS process.

FIG. 12A is a top-view image of the substrate illustrating the LWR and L-LER post spacer deposition using a 10-second 800V DCS process. FIG. 12B is a top-view image of the substrate illustrating the LWR and L-LER post SEMP using a 10-second 800V DCS process.

FIG. 15A is a side-view image of the patterned structure post spacer deposition where DCS using a second set of operating parameters was performed. FIG. 15B is a side-view image of the patterned structure post SEMP where DCS using a second set of operating parameters was performed. FIG. 15C is a tilted-view image of the patterned structure post SEMP where DCS using a second set of operating parameters was performed.

FIG. 16A is a side-view image of the patterned structure post spacer deposition where DCS using a third set of operating parameters was performed. FIG. 16B is a side-view image of the patterned structure post SEMP where DCS using a third set of operating parameters was performed. FIG. 16C is a tilted-view image of the patterned structure post SEMP where DCS using a third set of operating parameters was performed.

DETAILED DESCRIPTION OF EMBODIMENTS OF THE INVENTION

Figure 1A:
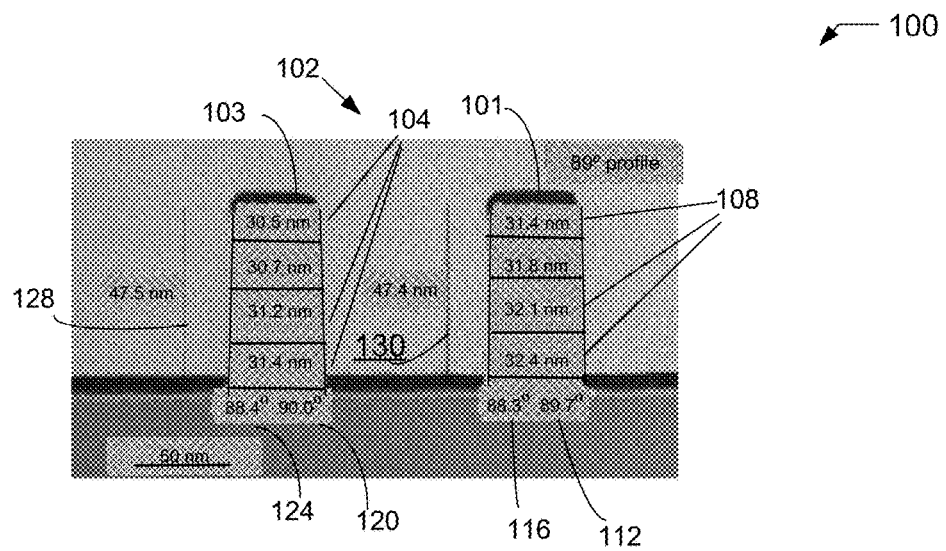

Methods and systems for RF power distribution in a multi-zone electrode array are presented. However, one skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention.

Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale. In referencing the figures, like numerals refer to like parts throughout.

Reference throughout this specification to "one embodiment" or "an embodiment" or variation thereof means that a particular feature, structure, material, or characteristic described in connection with the embodiment is included in at least one embodiment of the invention, but does not denote that they are present in every embodiment. Thus, the appearances of the phrases such as "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

Additionally, it is to be understood that "a" or "an" may mean "one or more" unless explicitly stated otherwise.

Various operations will be described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

As used herein, the term "substrate" means and includes a base material or construction upon which materials are formed. It will be appreciated that the substrate may include a single material, a plurality of layers of different materials, a layer or layers having regions of different materials or different structures in them, etc. These materials may include semiconductors, insulators, conductors, or combinations thereof. For example, the substrate may be a semiconductor substrate, a base semiconductor layer on a supporting structure, a metal electrode or a semiconductor substrate having one or more layers, structures or regions formed thereon. The substrate may be a conventional silicon substrate or other bulk substrate comprising a layer of semi-conductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

In the specifications, patterned structure and spacer, patterned structures and spacers, leaning angle and sidewall angle are used interchangeably.

Referring now to the drawings, where like reference numerals designate identical or corresponding parts throughout the several views.

FIG. 1A is a prior art schematic diagram 100 illustrating an input trapezoidal patterned structure in a substrate 102 prior to a plasma etch atomic layer deposition (PEALD) process and labelled as "89° profile". The patterned structure 103 on the left has a height of 47.5 nm as measured with line 128 whereas the patterned structure 101 on the right has a height of 47.4 nm as measured with line 130, which are from 2.5 to 2.6 nm shorter than the 50 nm of the original patterned structure (not shown) as indicated in the bottom of FIG. 1A. The pattern width 104 of patterned structure 103 at various heights shows 31.4 nm at the base and decreases to 30.5 nm at the top. Similarly, the pattern width 108 of patterned structure 101 at various heights shows 32.4 nm at the base and decreases to 31.4 nm at the top.

In addition to the patterned structure becoming trapezoidal instead of a rectangular shape, the sidewall angle, (also known as spacer leaning angle), on the left-hand side is 88.4 degrees 124 whereas the sidewall angles on the right-hand side are 88.3 degrees 116, and 89.7 degrees 112, of patterned structure 103 and 101 respectively, are less than 90 degrees. As will be seen in FIG. 1B and subsequent figures, the damage done to patterned structure on the substrate in the subsequent processing steps will cause leaning of the patterned structure.

Figure 1B:
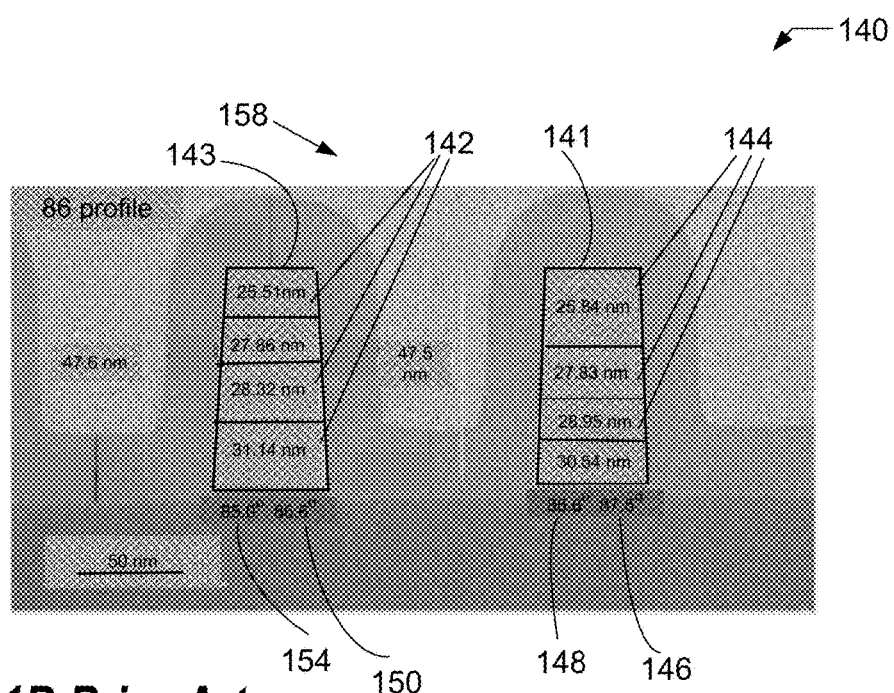
FIG. 1B is a prior art schematic diagram illustrating a trapezoidal spacer pattern of a substrate after a PEALD process.

FIG. 1B is a prior art schematic diagram 140 illustrating a trapezoidal spacer pattern of a substrate 158 after a PEALD process and labelled as "86 profile". The patterned structure 143 on the left is 47.6 nm whereas the patterned structure 141 on the right is 47.5 nm, which are from 2.0 to 2.5 nm shorter than the 50 nm of the original patterned structure (not shown) as indicated in the bottom of FIG. 1B. The pattern width 142 of patterned structure 143 at various heights shows 31.14 nm at the base and decreasing to 25.51 nm at the top. Similarly, the pattern width 144 of patterned structure 141 at various heights shows 30.54 nm at the base and decreasing to 25.84 nm at the top.

In addition to the patterned structure becoming trapezoidal instead of a rectangular shape, the sidewall angles on the left-hand side, 85.0 degrees 154, and 86.6 degrees 150 of patterned structure 143, and sidewall angles on the right-hand side of 86.6 degrees 148 and 87.5 degrees 146 of patterned structure 141 respectively, are substantially less than 90 degrees after the PEALD process.

Figure 2A:
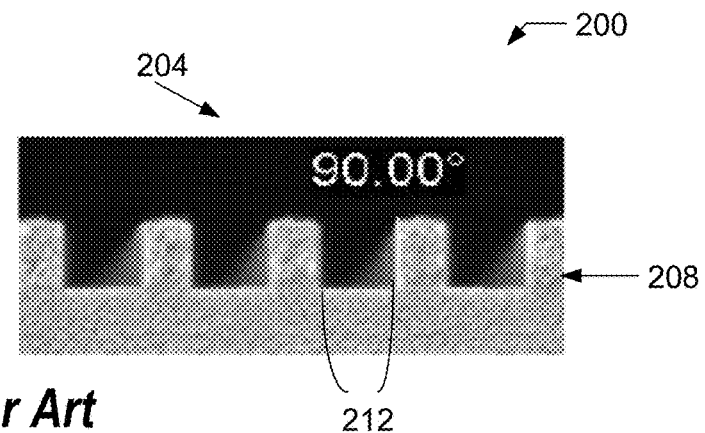
FIG. 2A is a prior art image illustrating a substrate prior to a PEALD process.
Figure 2B:
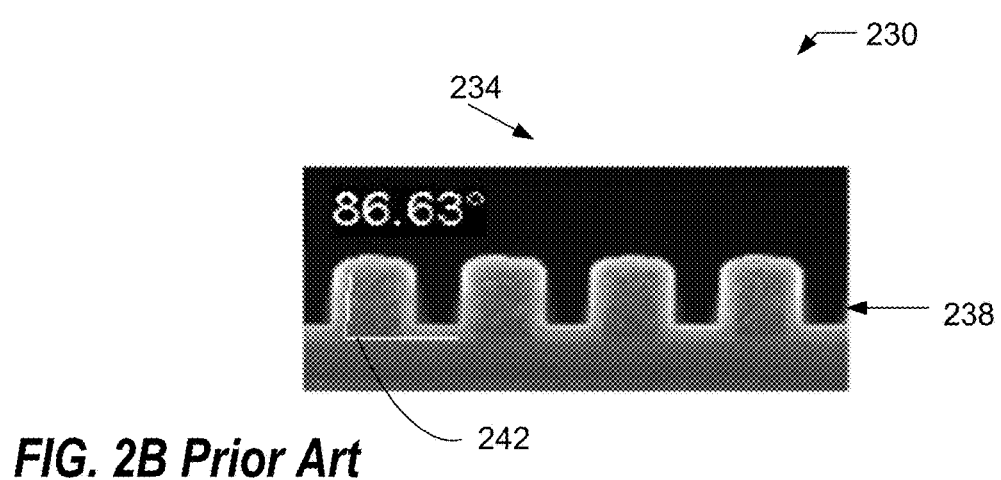
FIG. 2B is a prior art image illustrating a trapezoidal spacer pattern of a substrate after a PEALD process.
Figure 2C:
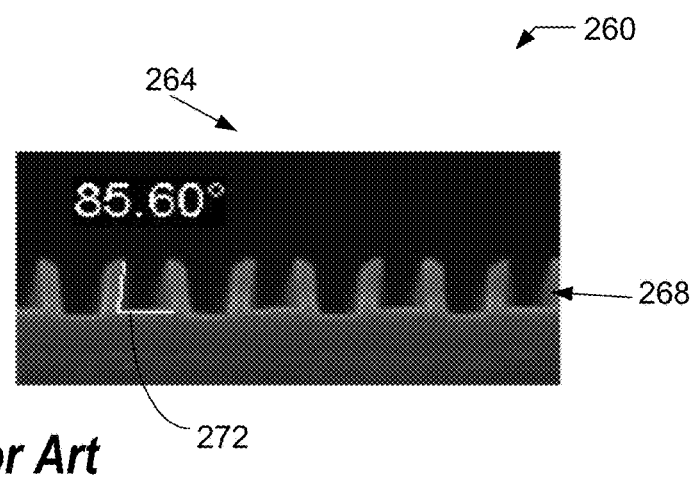
FIG. 2C is a prior art image illustrating tilting of the spacer on the substrate after a spacer etch mandrel pull process.

FIG. 2A is a prior art image 200 illustrating a substrate 204 prior to a PEALD process. The sidewall angles 212 of the patterned structure 208 are 90 degrees. FIG. 2B is a prior art image 230 illustrating a trapezoidal spacer 238 pattern of a substrate 234 after a PEALD process where the sidewall angle is 86.63 degrees. FIG. 2C is a prior art image 260 illustrating tilting of the spacers 268 on the substrate 264 after a spacer etch mandrel pull process where the sidewall angle is 85.60 degrees. As mentioned above, the change of the spacer pattern from a rectangular shape to a leaning trapezoidal shape pattern has cumulative negative effect on the fidelity of pattern transfer in subsequent steps.

Figure 3A:
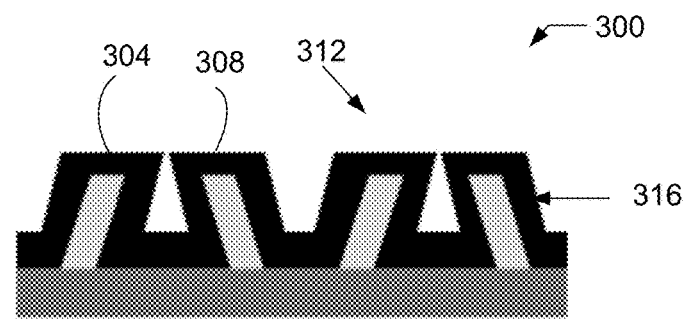
FIG. 3A is a prior art schematic block diagram illustrating spacer leaning in a self-aligned quadruple patterning (SAQP) substrate.
Figure 3B:
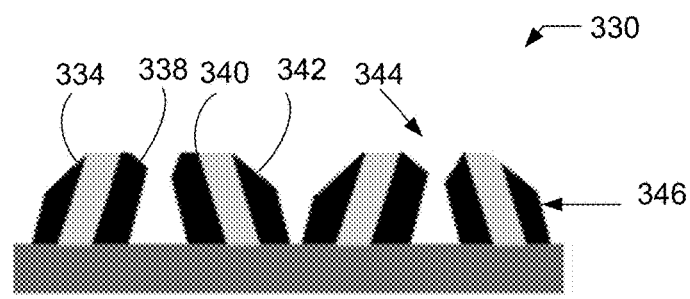
FIG. 3B is a prior art schematic diagram illustrating plasma faceting/sputtering in spacers of a substrate prior to the mandrel pull process.
Figure 3C:
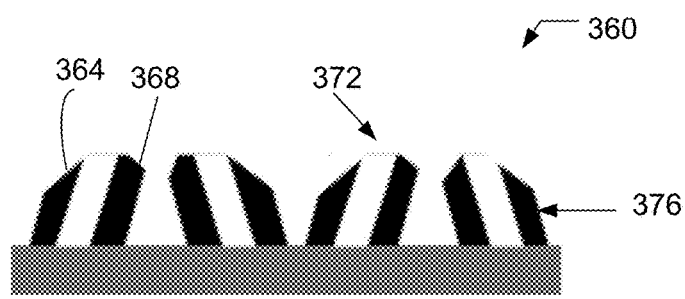
FIG. 3C is a prior art schematic block diagram illustrating the leaning and plasma faceting in spacers of a substrate after the mandrel pull process.

FIG. 3A is a prior art schematic diagram 300 illustrating spacer 316 leaning in SAQP. Adjacent pairs of spacers 304 and 308 are parallelograms in shape after the conformal deposition of a coating material. Spacer 304 on the left leans towards spacer 308 and spacer 308 on the right similarly leans towards spacer 304 on the left. FIG. 3B is a prior art schematic diagram 330 illustrating plasma faceting/sputtering prior to the mandrel pull process. The first pair of spacers, for example, 334 and 338, are affected by the first etch removing conformal material on the top and sides of the patterned structure 346. The spacer etch removed more conformal material from the left side than the right side of spacer 334. The other spacer 338 of the pair of spacers, 334 and 338, also has a facet but less conformal material was removed than in spacer 334. The second pair of spacers, 340 and 342, has the mirror image impact on the spacers, with spacer 342 having greater removal of conformal material than spacer 340. FIG. 3C is a prior art schematic diagram 360 illustrating that the leaning and plasma faceting on pair of spacers, for example, 364 and 368, of the spacers 376 remained after the mandrel pull process was completed on the substrate 372.

FIG. 4 is a prior art image 400 illustrating etch placement error issues due to rounding and leaning of the patterned structure 408 during previous deposition and etch cycles. The sides 404 of the patterned structure 408 show damage resulting in the rounding at the top instead of a rectangular shape. Edge placement error is measured as the difference between the intended and printed features in a substrate layer layout. EPEs outside the feature are considered positive errors and EPEs inside the feature are considered negative errors. The EPE can be expressed as range of percentage of error versus the intended dimension, for example, EPE measured in nm. Referring to FIG. 4, the edge placement error is noticeable when the distances 412 and 416 between the centers of two adjacent patterned structures 408 are compared where the first distance 412 is longer than the second distance 416.

FIG. 5A is a prior art top-view image 500 of a substrate 508 illustrating a defined line and space pattern 504 after a first spacer pull process. The top-view 500 of the line and space show relatively minor visual EPE compared to the EPE in FIG. 5B.

FIG. 5B is a prior art image 530 illustrating different shapes and height of masks due to plasma faceting or sputtering of spacers 538. The first pair of spacers 536 appears brighter than the second pair of spacers 534 that are darker. The difference in darkness is due to a difference in spacer height as a result of plasma faceting or sputtering of spacers 538 that gets amplified as the substrate 532 undergo cycles of deposition and SEMP processes. Two dotted lines 542 indicate the boundaries of the intended feature. EPE outside 540 the two dotted lines 542 are positive EPE and EPE inside 544 the two dotted lines 542 are negative EPE. The difference in height of the spacers 534 versus spacers 536 can impact the etch transfer margin of the final pattern transfer and results in a higher etch placement error than the acceptable range for the application.

Figure 5C:
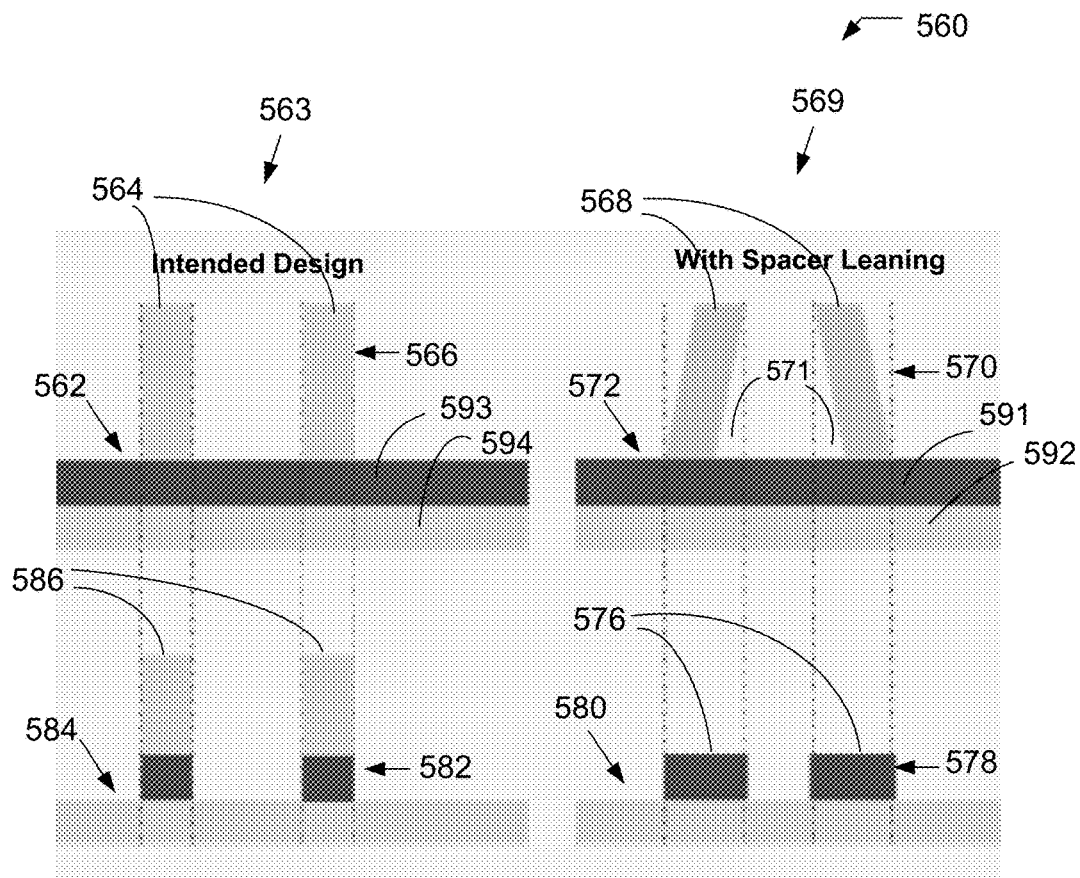
FIG. 5C is a side-view schematic diagram illustrating how spacer leaning affects the edge placement error.

FIG. 5C is a side-view schematic 560 illustrating how spacer leaning affects the edge placement error (EPE). An intended design CD schematic 563 shows the intended patterned structure 566 above the organic layer 593 and the underlayer 594 with a CD 564 in a substrate 562. If there is no spacer leaning, i.e., the spacer sidewall is 90 degrees, the SEMP will result in the same intended design CD 586 of the patterned structure 582 of substrate 584.

However, if there is spacer leaning as in spacer leaning schematic 569, i.e., the sidewall angle of the patterned spacer 570 is not 90 degrees, the spacer leaning causes etch shadowing 571 of the patterned structure 570 above the organic layer 591 and the underlayer 592 with a CD 568 in a substrate 572. The etch shadowing 571 in turn causes a wider CD 576 into the underlying film 573 than the intended design CD 586. The patterned structure 578 has the wider CD 576 in substrate 580. As mentioned above, edge placement error is measured as the difference between the intended and printed features, the edge placement of the intended design CD will be different from the printed CD when spacer leaning exists. The EPE can be expressed as percentage of the difference of the actual placement CD less the intended CD, divided by the intended CD.

Figure 6A:
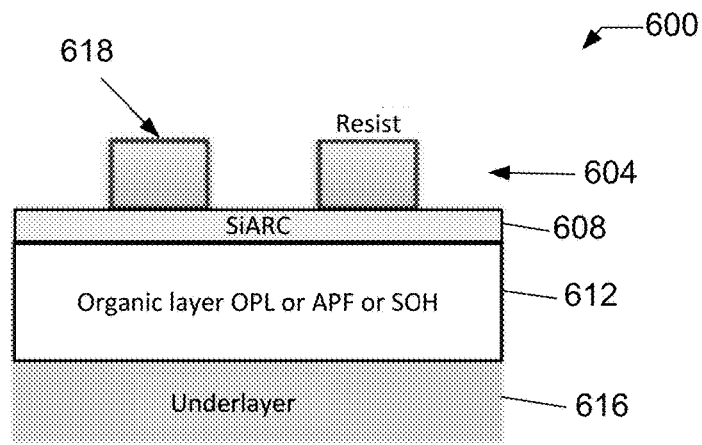
FIG. 6A is a current art flowchart diagram illustrating a resist layer, a silicon anti-reflective coating (SiARC) layer, an organic layer, and an underlayer.
Figure 6B:
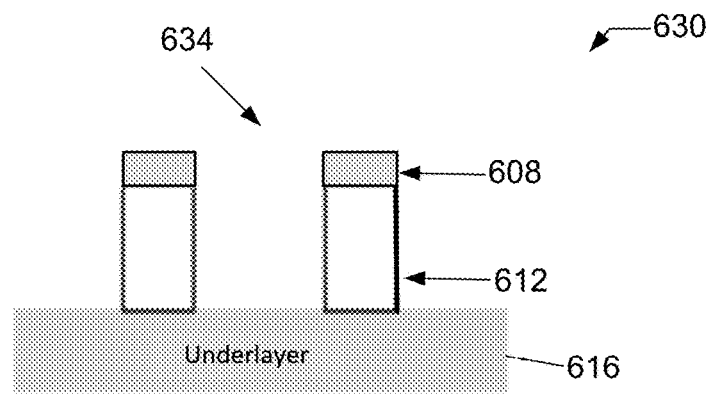
FIG. 6B is a current art diagram illustrating the substrate after an etch removing the SiARC layer and the resist layer.
Figure 6C:
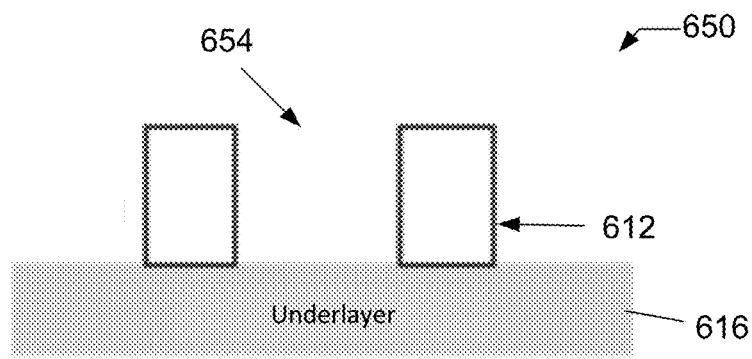
FIG. 6C is a current art diagram illustrating removal of the remaining SiARC on the patterned structure.
Figure 6D:
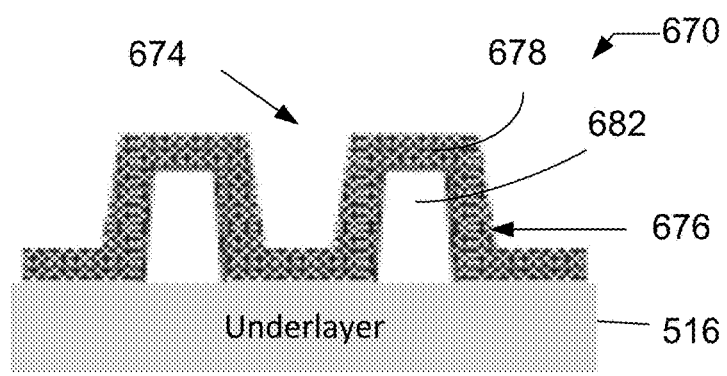
FIG. 6D is a current art diagram illustrating how the spacers on the substrate are trapezoidal in shape and the conformal deposition following the pattern of the substrate.
Figure 6E:
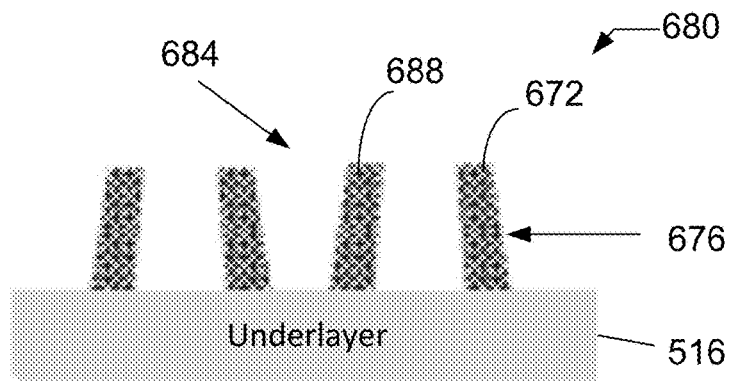
FIG. 6E is a current art diagram illustrating spacers leaning in pairs of trapezoidal shapes after a series of deposition and removal processes.

FIG. 6A is a current art schematic diagram 600 illustrating a resist layer 604, a silicon anti-reflective coating (SiARC) layer 608, an organic layer 612, and an underlayer 616. FIG. 6B is a current art schematic diagram 630 illustrating the substrate 634 after an etch removing the SiARC layer 608 and the top portion of the resist layer leaving the portion previously covered by the resist in the SiARC layer. FIG. 6C is a current art schematic diagram 650 illustrating removal of the remaining SiARC on the patterned structure 612 on the substrate 654. FIG. 6D is a current art schematic diagram 670 illustrating how the patterned structure 676 on the substrate 674 are trapezoidal in shape and the conformal deposition follows the pattern of the substrate 674. FIG. 6E is a current art schematic diagram 680 illustrating spacers 688 leaning in a pairs of trapezoidal shapes, 688 and 672, after a series of deposition and removal processes. As mentioned above, the change of the spacer pattern from a rectangular shape to a leaning trapezoidal shape pattern has cumulative negative effect on the fidelity of pattern transfer in subsequent steps. The change to a leaning trapezoidal shape pattern can impact the etch transfer margin of the final pattern transfer and result in a higher etch placement error than the acceptable range for the application.

In an embodiment of the present invention, the same steps as described in connection with FIG. 6A, FIG. 6B, and FIG. 6C are performed, generating a patterned structure layer comprising a layer of rectangular patterned structure that can comprise an organic planarizing layer (OPL), an advanced pattern film (APF), or a spin-on hardmask (SOH) as the input substrate in FIG. 7A. Other ALD films can also be used.

Figure 7A:
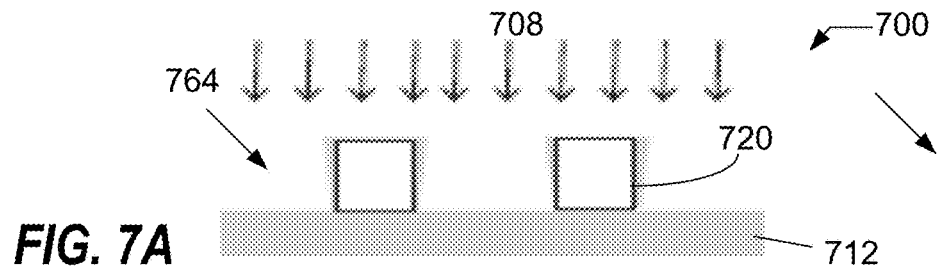
FIG. 7A is a schematic diagram illustrating the direct current superposition (DCS) plasma treatment of the patterned structure in the substrate in an embodiment of the present invention.

FIG. 7A is a schematic diagram 700 illustrating the direct current superposition (DCS) plasma treatment of the patterned structure (or mandrel) 720 in the substrate 764 in an embodiment of the present invention. The substrate 764 is exposed to DCS superposition plasma 708. The invention comprises a method and system to protect the organic mandrel post patterning before conducting the PEALD deposition to ensure that the mandrel shape will remain intact and that the spacers will be straight post PEALD deposition. After the mandrel is patterned, it is exposed to direct current superposition plasma that produces an electron flux or ballistic electron beam and sputters the top electrode material which can deposit as a thin layer of the material on the mandrel.

Figure 7B:
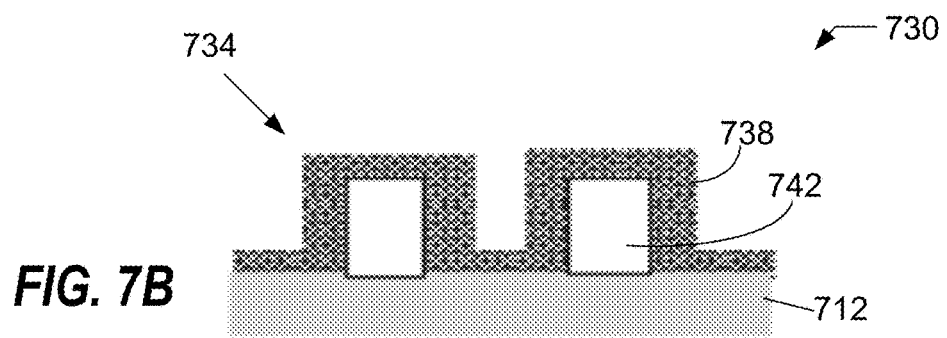
FIG. 7B is a schematic diagram illustrating the post ALD patterned structure in the substrate without spacer leaning in an embodiment of the present invention.
Figure 7C:
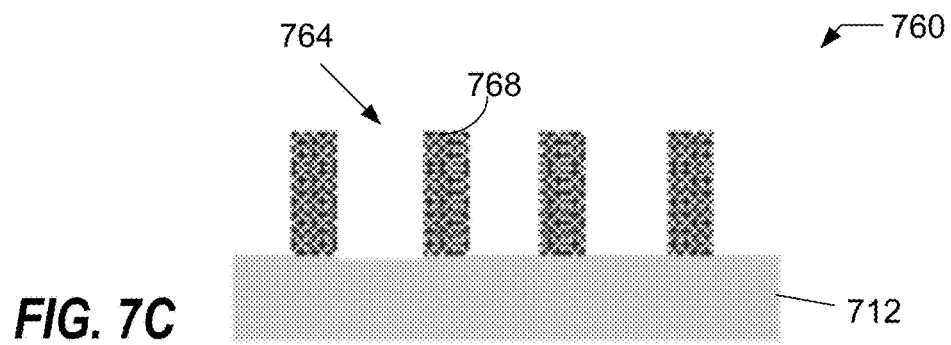
FIG. 7C is a schematic diagram illustrating the post spacer etch mandrel pull structure highlighting the spacers without leaning in an embodiment of the present invention.

FIG. 7B is a schematic diagram 730 illustrating the post ALD pattern of the patterned structure 738 in the substrate 734 without or with reduced spacer leaning in an embodiment of the present invention. The patterned structure or mandrel 742 then goes through the PEALD deposition during which this thin film (not shown) from the top electrode material will protect the mandrel and get oxidized by the O2 plasma (not shown) process. FIG. 7C is a schematic diagram 760 illustrating patterned structure 768 of the substrate 764 post spacer etch mandrel pull processes in an embodiment of the present invention.

This invention enables high fidelity pattern transfer by controlling the leaning associated with spacers in multi-patterning using organic mandrels. This invention has a low cost of ownership because the mandrel patterning and post mandrel patterning protection can be conducted in the same chamber. Although the process would add one pass in an etch chamber equipped with DCS superposition, the processing time is 60 seconds or less depending on the application. The mandrel treatment time can be adjusted to ensure adequate protection from the subsequent PEALD O2 plasma. The inventors found out that about fifteen seconds or more yielded adequate amount of protection on the top and sidewalls of the mandrel to prevent/alleviate spacer leaning due to mandrel consumption.

This invention addresses a known issue when depositing a PEALD spacer onto organic mandrels which includes damage to the mandrels that results in spacer leaning and a change from rectangular to trapezoidal profile. As mentioned above, a novelty of this invention is to make use of a thin material deposited layer from DCS plasma onto the mandrel to protect the mandrel prior to the PEALD step. The thin material can be a silicon film that is oxidized during the first PEALD O2 plasma cycle and the resulting final film can be a conformal layer of silicon oxide which has no negative impact to downstream integration. Other material combinations can also be used.

From the data collected during the test conducted by the inventors, unexpected results included the spacer thickness increasing when DCS current treatment was performed. This increase in thickness can be taken into account and controlled and the PEALD deposition can be fine-tuned in conjunction with the DCS treatment to target appropriate spacer thickness, sidewall angle, and reduce edge placement error (EPE) to acceptable ranges depending on the application and the number of iterations of the deposition and SEMP cycle.

Figures 8A, 8B:
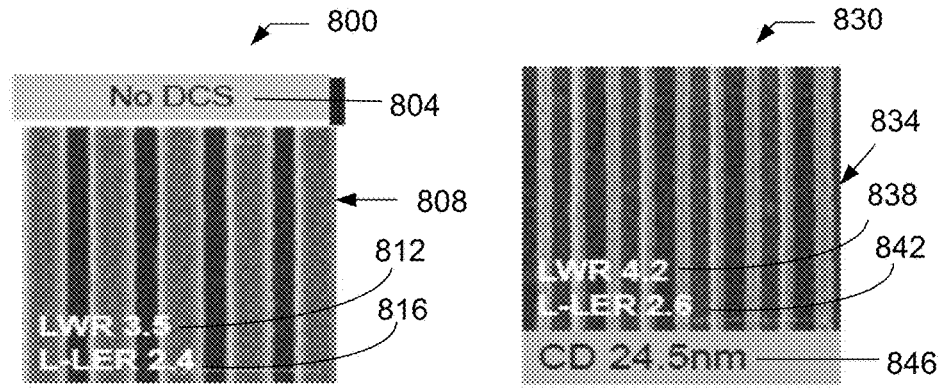
FIG. 8A and FIG. 8B are paired images that highlight the integration results when the DCS step is not performed.

FIG. 8A is a top-view image 800 of the substrate 808 when no DCS 804 is performed, highlighting the line width roughness (LWR) 812 of 3.5 nm and left-line edge roughness (L-LER) 816 of 2.4 nm post spacer deposition. FIG. 8B is a top-view image 830 of the substrate 834 when no DCS is performed, highlighting the LWR 838 of 4.2 nm, L-LER 842 of 2.6, and critical dimension (CD) of 24.5 nm post spacer etch mandrel pull (SEMP).

Figures 9A, 9B:
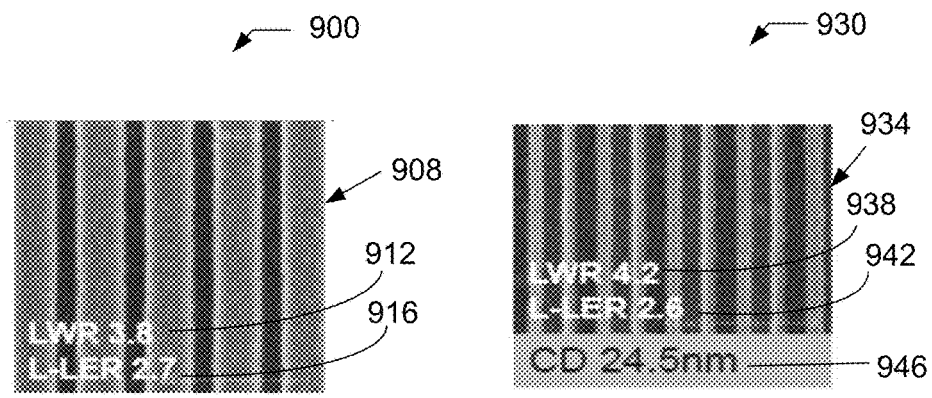

FIG. 9A is a top-view image 900 of the substrate 908 illustrating the LWR 912 of 3.8 nm and L-LER 916 of 2.7 nm post spacer deposition using a 10-second DCS process. FIG. 9B is a top-view image 930 of the substrate 934 illustrating the LWR 938 of 4.2 nm, the L-LER 942 of 2.6 nm, and the CD 946 of 24.5 nm post SEMP using a 10-second DCS process.

Figures 10A, 10B:
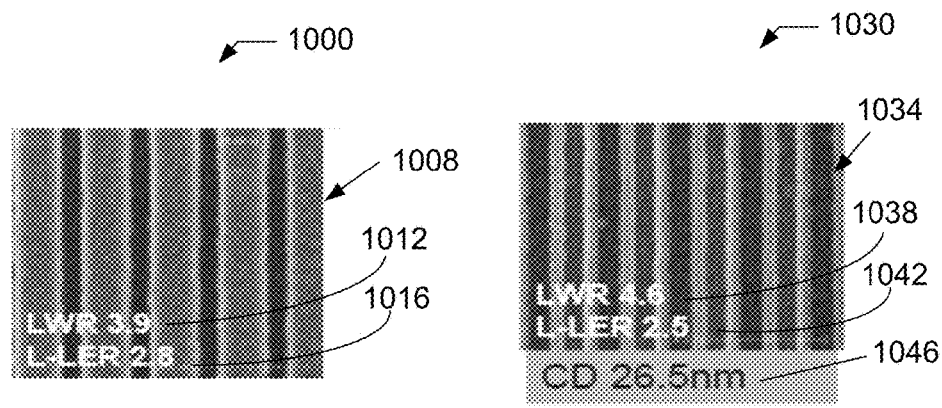

FIG. 10A is a top-view image 1000 of the substrate 1008 illustrating the LWR 1012 of 3.9 nm and L-LER 1016 of 2.8 nm post spacer deposition using a 20-second DCS process. FIG. 10B is a top-view image 1030 of the substrate 1034 illustrating the LWR 1038 of 4.6 nm, the L-LER 1042 of 2.5 nm, and the CD 1046 of 26.5 nm post SEMP using a 20-second DCS process.

FIG. 11A is a top-view image 1100 of the substrate 1108 illustrating the LWR 1112 of 3.8 nm and L-LER 1116 of 2.7 nm post spacer deposition using a 10-second 600V DCS process. FIG. 11B is a top-view image 1130 of the substrate 1134 illustrating the LWR 1138 of 4.2 nm, the L-LER 1142 of 2.6 nm, and the CD 1146 of 24.5 nm post SEMP using a 10-second 600V DCS process.

FIG. 12A is a top-view image 1200 of the substrate 1208 illustrating the LWR 1212 of 3.5 nm and L-LER 1216 of 2.4 nm post spacer deposition using a 10-second 800V DCS process. FIG. 12B is a top-view image 1230 of the substrate 1234 illustrating the LWR 1238 of 4.2 nm, the L-LER 1242 of 2.6 nm, and the CD 1246 of 24.5 nm post SEMP using a 10-second 800V DCS process.

Figures 13A, 13B, 13C:
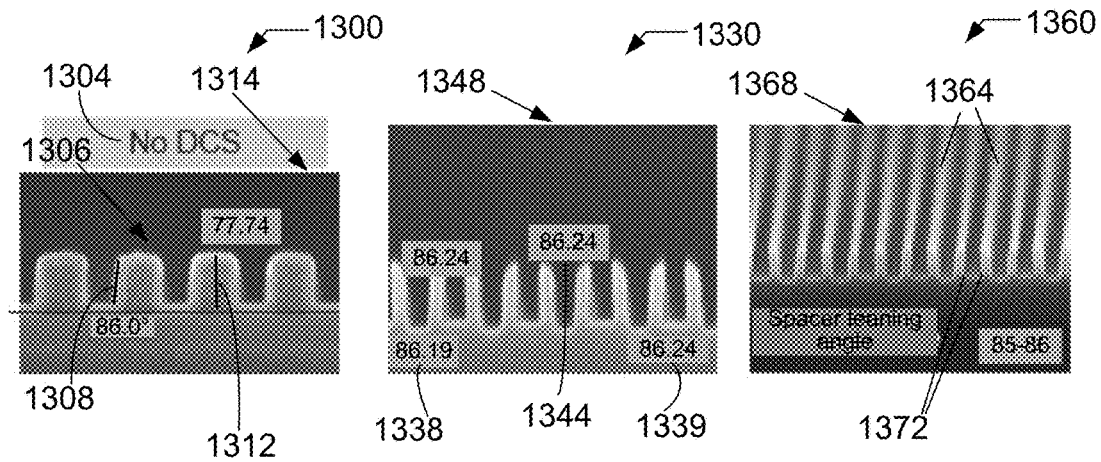
FIG. 13A is a side-view image 1300 of the patterned structure where no DCS was used.
FIG. 13B is a side-view image of the patterned structure where no DCS was used highlighting the leaning angle of the spacers.
FIG. 13C is a tilted-view image of the patterned structure where no DCS was used highlighting the leaning angle of the spacers.

The next set of figures, FIG. 13A to FIG. 16C, are sets of three images including a set where DCS was not performed and other sets where the pressure, voltage, power, processing time, flowrate of H2, and/or flowrate of Ar are varied in order to determine the range of operating variables that provide the acceptable results. FIG. 13A is a side-view image 1300 of the substrate 1314 where no DCS 1304 was used, highlighting the patterned structure 1306 sidewall angle 1308 at 86.0 degrees and height 1312 of 77.74 nm post spacer deposition. FIG. 13B is a side-view image 1330 of the substrate 1348 where no DCS was used, highlighting the height of the spacers 1338 on the left of 86.19 nm and 1339 on the right of 86.24 nm, and the distance 1344 of the spacers at 86.24 nm post SEMP. FIG. 13C is a tilted-view image 1360 of the substrate 1368 where no DCS was used highlighting the leaning angle 1372 of the spacers 1364 of 85 to 86 degrees.

Figures 14A, 14B, 14C:
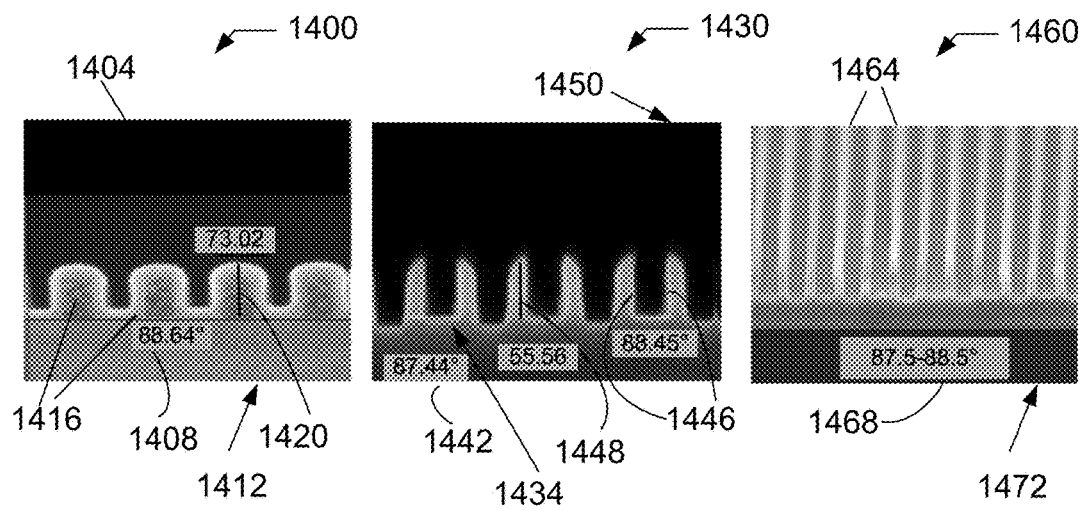
FIG. 14A is a side-view image of the patterned structure post spacer deposition where DCS using a first set of operating parameters was performed.
FIG. 14B is a side-view image of the patterned structure post SEMP where DCS using a first set of operating parameters was performed.
FIG. 14C is a tilted-view image of the patterned structure post SEMP where DCS using a first set of operating parameters was performed.

FIG. 14A is a side-view image 1400 of the patterned structure 1416 substrate 1412 where DCS was used using a first set of operating parameters for Blade 1 1404 with 100 mT, 10 s, 900V, 100 W HRF, 100 sccm H2/800 sccm Ar. The side-view image 1400 highlights the patterned structure 1416 leaning angle 1408 at 88.64 degrees and spacer height 1420 of 73.02 nm post spacer deposition. FIG. 14B is a side-view image 1430 of the substrate 1450 post SEMP where DCS was used as previously mentioned in relation to FIG. 14A. The measured leaning angle 1442 of spacer 1434 on the left side is 87.44 degrees; the measured leaning angle 1446 of spacer 1434 on the right side is 88.45 degrees; and the measured spacer height 1448 is 55.56 nm. FIG. 14C is a tilted-view image 1460 of the substrate 1472 where DCS was used as previously mentioned in relation to FIG. 14A, highlighting the leaning angle 1468 of the spacers 1464 of 87.5-88.5 degrees.

FIG. 15A is a side-view image 1500 of the patterned structure 1516 of substrate 1512 post spacer deposition where DCS was performed using a second set of operating parameters for Blade 2 1504 comprising with 100 mT, 20 s, 900V, 100 W HRF, 100 sccm H2/800 sccm Ar where the spacer height 1508 is 69.85 nm. FIG. 15B is a side-view image 1530 of the patterned structure 1538 post SEMP where DCS was performed as previously mentioned in relation to FIG. 15A. The measured leaning angle 1542 of spacer 1538 on the left side is 89.18 degrees; the measured leaning angle 1544 of spacer 1538 on the right side is 89.14 degrees; and the measured spacer height 1546 is 53.88 nm. FIG. 15C is a tilted-view image 1560 of the patterned structure 1564 post SEMP where DCS was performed as previously mentioned in relation to FIG. 15A, highlighting the leaning angle 1568 of the spacer 1564 of 89 degrees.

FIG. 16A is a side-view image 1600 of the patterned structure 1616 of substrate 1612 post spacer deposition where DCS was performed using a third set of operating parameters for Blade 3 1604 comprising with 100 mT, 20 s, 600V, 100 W HRF, 100 sccm H2/800 sccm Ar where the patterned structure height 1608 is 69.85 nm. FIG. 16B is a side-view image 1630 of the patterned structure 1638 post SEMP where DCS was performed as previously mentioned in relation to FIG. 16A. The measured leaning angle 1642 of spacers 1638 on the left side is 89.23 degrees; the measured leaning angle 1644 of spacers 1638 on the right side is 87.18 degrees; and the measured spacer height 1646 is 53.97 nm. FIG. 16C is a tilted-view image 1660 of the patterned structure 1664 post SEMP where DCS was performed as previously mentioned in relation to FIG. 16A, highlighting the leaning angle 1668 of the spacers 1664 of 87 to 89 degrees.

Figure 17A:
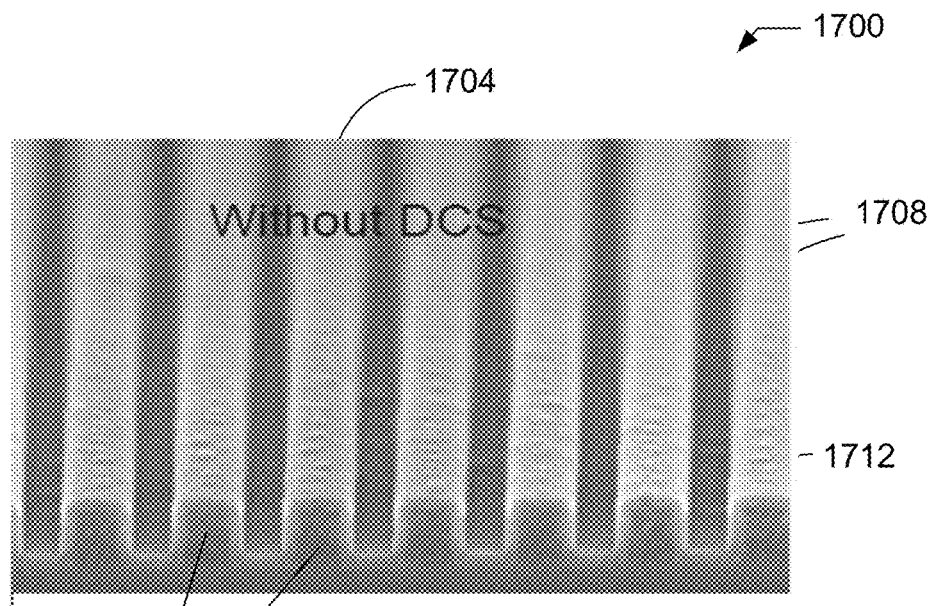
FIG. 17A is a tilted-view image of the patterned structure post PEALD deposition where no DCS was used, illustrating the formation of a trapezoidal pattern and damage to the conformal layer.
Figure 17B:
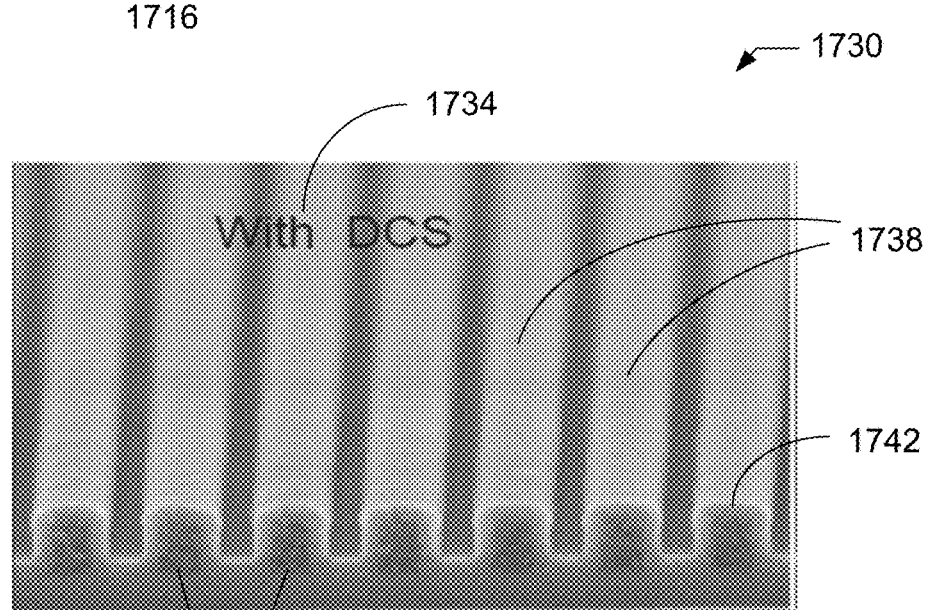
FIG. 17B is a tilted-view image of the patterned structure post PEALD deposition where DCS was performed, illustrating retention of the rectangular pattern with no discernible damage to the conformal layer.

FIG. 17A is a tilted-view image 1700 of the patterned structure 1716 post PEALD deposition labelled "Without DCS" 1704, illustrating the formation of a trapezoidal pattern 1712 and damage 1708 to the conformal layer. FIG. 17B is a tilted-view image 1730 of the patterned structure 1736 post PEALD deposition labelled "With DCS" 1734, illustrating retention of the rectangular pattern 1742 with no discernible damage 1738 to the conformal layer.

Figure 18:
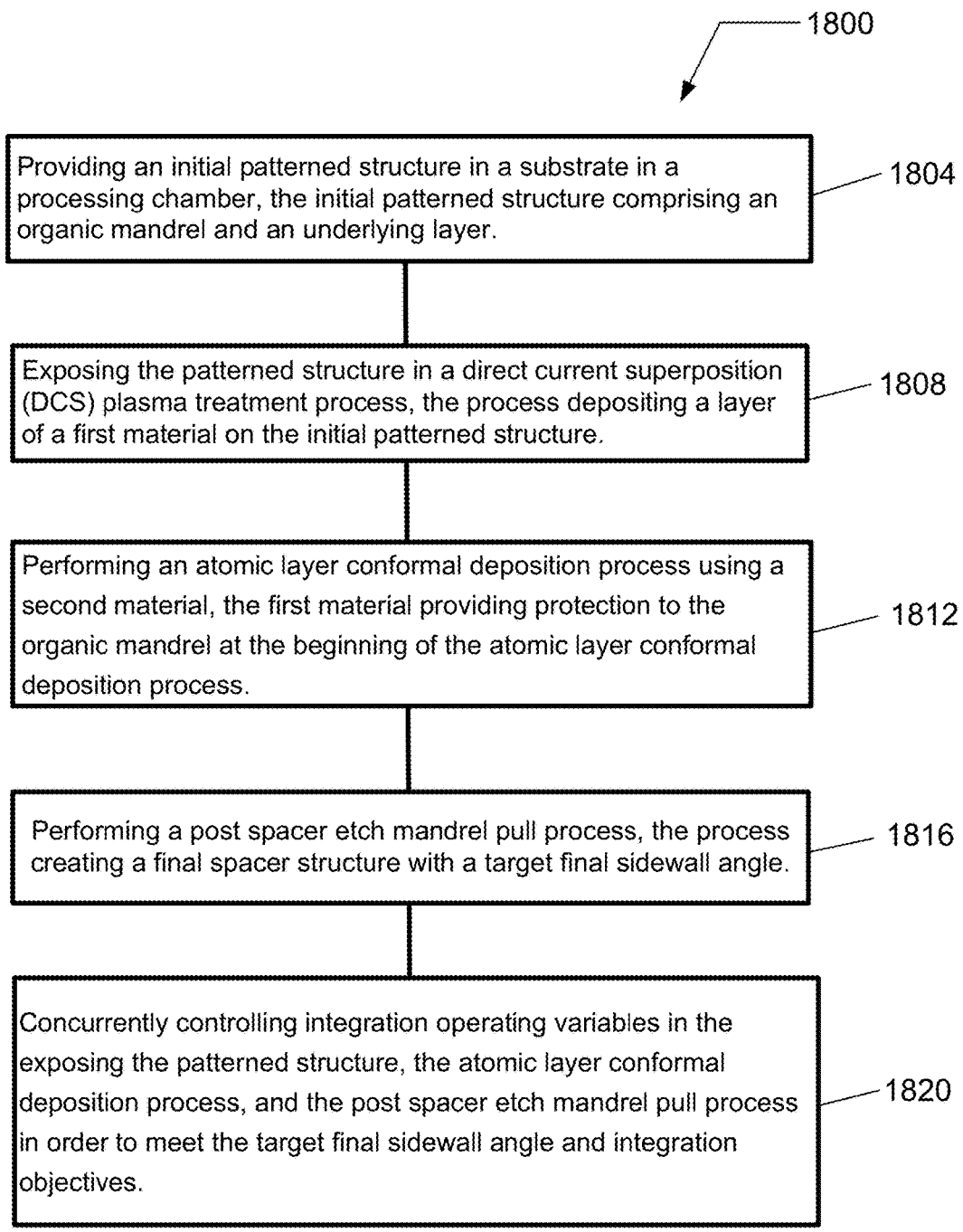
FIG. 18 is an exemplary flowchart diagram illustrating operations of the method for preventing leaning of the patterned structure and reducing edge placement error during a patterning process in an embodiment of the present invention.

FIG. 18 is an exemplary flowchart 1800 diagram illustrating operations of the method for preventing leaning of the spacer patterned structure and reducing edge placement error during a patterning process in an embodiment of the present invention. In operation 1804, an initial patterned structure in a substrate is provided in a processing chamber, the initial patterned structure comprising an organic mandrel and an underlying layer. The organic mandrel can comprise a resist, OPL, APF, and/or SOH. The APF can include chemical vapor deposition (CVD) amorphous carbon film with high carbon content and some hydrogen, the SOH can include spin-on organic polymer carbon content greater than 90%, and the OPL with compositions of C/H/O/N 81.6/4.6/9.9/3.9 wt % or OPL with compositions of C/H/O/N 85.4/5.8/6.0/2.9 wt %.

In operation 1808, the patterned structure is exposed to a DCS plasma treatment process, the process depositing a layer of a first material on the initial patterned structure, the first material providing protection to the organic mandrel at the beginning of the atomic layer conformal deposition process. The first material can be silicon which can come from a silicon electrode of the plasma source. Other materials can also be used. The exposure time of the substrate to the DCS plasma treatment process can be in a range from 15 to 25 seconds, a range from 10 to 30 seconds, or a range from 31 to 60 seconds. The DCS voltage can be from 700 to 1100 volts, the temperature in the processing chamber can be in a range from 15 to 40 degrees C., the high frequency radio frequency (RF) source is in a range from 80 to 119 MHz, and the EPE can be in a range from plus or minus 0.1 to 3.0%.

In operation 1812, conformal plasma enhanced atomic layer deposition (PEALD) process using a second material is performed, as mentioned above, the first material providing protection to the organic mandrel at the beginning of the atomic layer conformal deposition process. If the first material is silicon, then the second material must be silicon oxide. The first material reacts with O2 in the plasma and becomes silicon oxide which then protects the patterned structure of the organic mandrel from due to the O2 oxidizing action on the organic mandrel. As discussed in detail above, the protection provided by the silicon oxide greatly reduces or stops the leaning of the mandrel that results in impaired fidelity of pattern transfer, roughness issues, and EPE. Other pairs of first and second materials can also be used. The LWR of the patterned structure in the substrate post conformal ALD can be in a range from 3.5 to 4.0 nm and the L-LER can in a range from 2.2 to 3.0 nm.

In operation 1816, a spacer etch mandrel pull (SEM') process is performed, the process creating a final patterned structure with a target final sidewall angle. The gas mixture used can comprise H2/Ar where the H2 flowrate can be in a range of 80 to 119 sccms and the Ar flowrate can be in a range of 80 to 119 sccms. The LWR of the patterned structure in the substrate post SEM' can be in a range from 4.0 to 4.8 nm and the L-LER can in a range from 2.0 to 2.8 nm. The technology to perform the exposing the patterned structure process, the atomic layer conformal deposition process, and the spacer etch mandrel pull process are known to knowledgeable people in the art and will not be repeated here.

In operation 1820, integration operating variables in the exposing the patterned structure process, the atomic layer conformal deposition process, and the spacer etch mandrel pull process are concurrently controlled in order to meet the target final sidewall angle and other integration objectives. The integration objectives can include one or more of etch placement error (EPE), target spacer sidewall angle, target DCS process time, target spacer thickness, target cost of ownership, target substrate throughput, and the like. For example, the integration objectives may include an EPE of +0.1 to +3.0% or −0.1 to −3.0%, a target spacer sidewall angle of 89 to 90 degrees, and a target DCS exposure time of less than 30 seconds. Other combination of integration objectives may also be used.

During the series of tests conducted by the inventors, the inventors were surprised to find out the target spacer sidewall angle of 89 to 90 degrees can be achieved with less than 30 seconds of DCS exposure time. In some cases, depending on the application, acceptable LWR and L-LER were achievable with the 19 seconds or less of DCS exposure time. Upon further inspection, the inventors also found out that the thickness of the conformal deposition layer was in the range of 2 to 3 nm, which potentially can be further reduced, thus further shortening the DCS exposure time needed to achieve the target spacer sidewall angle of, for example, 89 to 90 degrees. Overall, adding the DCS plasma treatment process, operation 1808, in the recipe improved cost of ownership due to less reprocessing, effectively increasing substrate throughput. Due to the elimination or reduction of spacer leaning, the fidelity of pattern transfer substantially improved, especially when a series of deposition and SEMP's are utilized.

Figure 19:
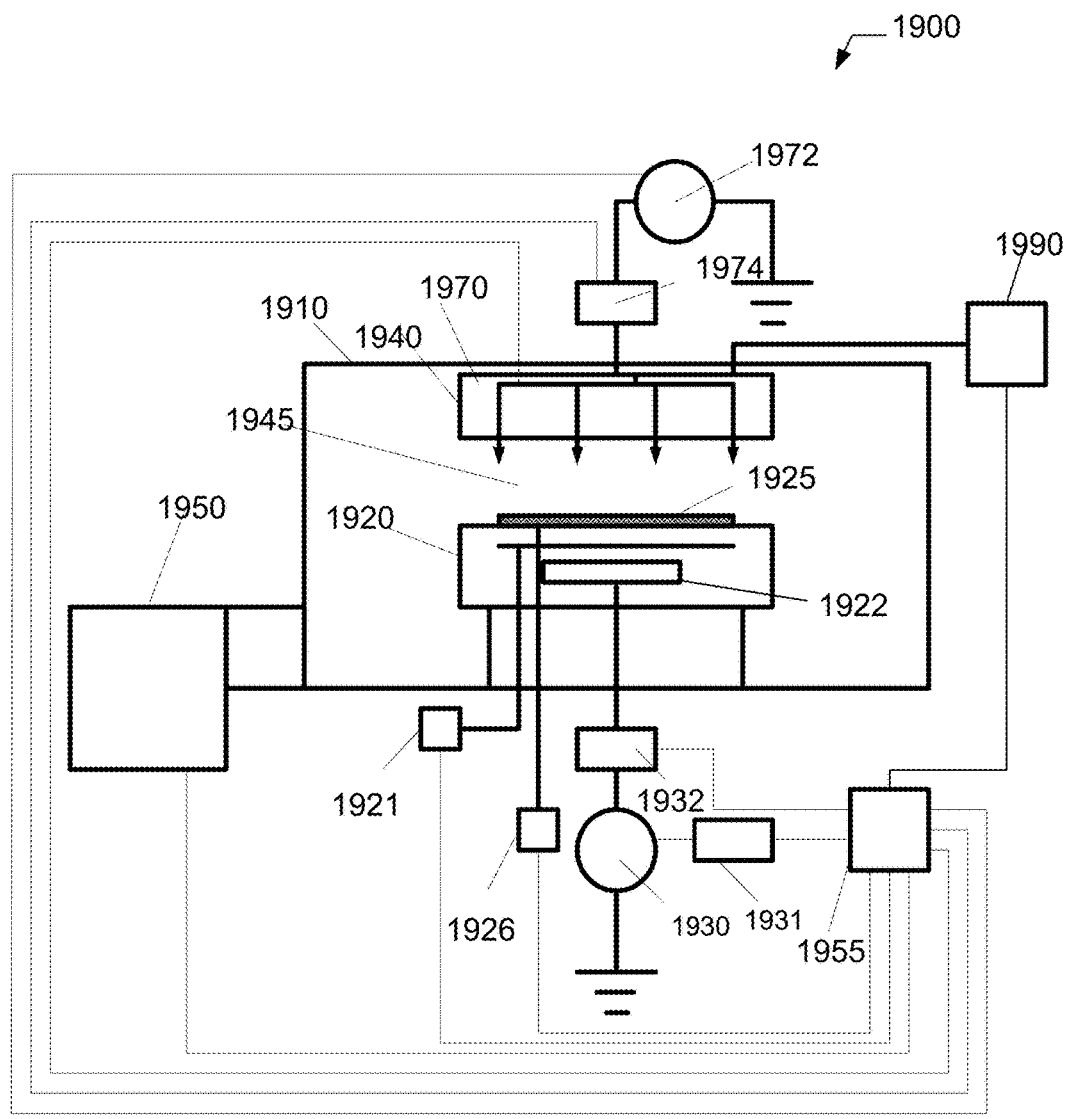
FIG. 19 is an exemplary systems chart including a controller of an integration system utilizing the DSA patterning process in an embodiment of the present invention.

FIG. 19 is an exemplary systems chart including a controller of an integration system utilizing the DCS patterning process in an embodiment of the present invention. A plasma etch system 1900 configured to perform the above identified process conditions is depicted in FIG. 19 comprising a processing chamber 1910, substrate holder 1920, upon which a substrate 1925 to be processed is affixed, and vacuum pumping system 1950. Substrate 1925 can be a semiconductor substrate, a wafer, a flat panel display, or a liquid crystal display. Processing chamber 1910 can be configured to facilitate etching the processing region 1945 in the vicinity of a surface of substrate 1925. An ionizable gas or mixture of process gases is introduced via a gas distribution system 1940. For a given flow of process gas, the process pressure is adjusted using the vacuum pumping system 1950. The processing can aid the removal of material from the exposed surfaces of substrate 1925. The etch processing system 1900 can be configured to process substrates of any desired size, such as 190 mm substrates, 300 mm substrates, or larger.

Substrate 1925 can be affixed to the substrate holder 1920 via a clamping system 1928, such as a mechanical clamping system or an electrical clamping system (e.g., an electrostatic clamping system). Furthermore, substrate holder 1920 can include a heating system (not shown) or a cooling system (not shown) that is configured to adjust and/or control the temperature of substrate holder 1920 and substrate 1925. The heating system or cooling system may comprise a re-circulating flow of heat transfer fluid that receives heat from substrate holder 1920 and transfers heat to a heat exchanger system (not shown) when cooling, or transfers heat from the heat exchanger system to substrate holder 1920 when heating. In other embodiments, heating/cooling elements, such as resistive heating elements, or thermo-electric heaters/coolers can be included in the substrate holder 1920, as well as the chamber wall of the processing chamber 1910 and any other component within the processing system 1900.

Additionally, a heat transfer gas can be delivered to the backside of substrate 1925 via a backside gas supply system 1926 in order to improve the gas-gap thermal conductance between substrate 1925 and substrate holder 1920. Such a system can be utilized when temperature control of the substrate is required at elevated or reduced temperatures. For example, the backside gas supply system can comprise a two-zone gas distribution system, wherein the helium gas-gap pressure can be independently varied between the center and the edge of substrate 1925.

In the embodiment shown in FIG. 19, substrate holder 1920 can comprise an upper electrode 1970 and a lower electrode 1922 through which RF power is coupled to the processing region 1945. For example, substrate holder 1920 can be electrically biased at a RF voltage via the transmission of RF power from a RF generator 1930 through an optional impedance match network 1932 to substrate holder 1920. The RF electrical bias can serve to heat electrons to form and maintain plasma. In this configuration, the system can operate as a reactive ion etch (RIE) reactor, wherein the chamber and an upper gas injection electrode serve as ground surfaces. A typical frequency for the RF bias can range from about 0.1 MHz to about 80 MHz. RF systems for plasma processing are well known to those skilled in the art.

Furthermore, the electrical bias of electrode 1922 at an RF voltage may be pulsed using pulsed bias signal controller 1931. The RF power output from the RF generator 1930 may be pulsed between an off-state and an on-state, for example. Alternately, RF power is applied to the substrate holder electrode at multiple frequencies. Furthermore, impedance match network 1932 can improve the transfer of RF power to plasma in plasma processing chamber 1910 by reducing the reflected power. Match network topologies (e.g. L-type, π-type, T-type, etc.) and automatic control methods are well known to those skilled in the art.

Gas distribution system 1940 may comprise a showerhead design for introducing a mixture of process gases. Alternatively, gas distribution system 1940 may comprise a multi-zone showerhead design for introducing a mixture of process gases and adjusting the distribution of the mixture of process gases above substrate 1925. For example, the multi-zone showerhead design may be configured to adjust the process gas flow or composition to a substantially peripheral region above substrate 1925 relative to the amount of process gas flow or composition to a substantially central region above substrate 1925 or split into a center flow and an edge flow.

Vacuum pumping system 1950 can include a turbo-molecular vacuum pump (TMP) capable of a pumping speed up to about 8000 litters per second (and greater) and a gate valve for throttling the chamber pressure. In conventional plasma processing devices utilized for dry plasma etching, an 800 to 3000 litter per second TMP can be employed. TMPs are useful for low pressure processing, typically less than about 50 mTorr. For high pressure processing (i.e., greater than about 80 mTorr), a mechanical booster pump and dry roughing pump can be used. Furthermore, a device for monitoring chamber pressure (not shown) can be coupled to the plasma processing chamber 1910.

As mentioned above, the controller 1955 can comprise a microprocessor, memory, and a digital I/O port capable of generating control voltages sufficient to communicate and activate inputs to processing system 1900 as well as monitor outputs from plasma processing system 1900. Moreover, controller 1955 can be coupled to and can exchange information with RF generator 830, pulsed bias signal controller 1931, impedance match network 1932, the gas distribution system 1940, vacuum pumping system 1950, as well as the substrate heating/cooling system (not shown), the backside gas supply system 1926, and/or the electrostatic clamping system 1921. For example, a program stored in the memory can be utilized to activate the inputs to the aforementioned components of processing system 1900 according to a process recipe in order to perform a plasma assisted process, such as a plasma etch process or a PHT process, on substrate 1925.

In addition, the processing system 1900 can further comprise an upper electrode 1970 to which RF power can be coupled from RF generator 1972 through optional impedance match network 1974. A frequency for the application of RF power to the upper electrode can range from about 0.1 MHz to about 190 MHz. Additionally, a frequency for the application of power to the lower electrode can range from about 0.1 MHz to about 80 MHz. Moreover, controller 1955 is coupled to RF generator 1972 and impedance match network 1974 in order to control the application of RF power to upper electrode 1970. The design and implementation of an upper electrode is well known to those skilled in the art. The upper electrode 1970 and the gas distribution system 1940 can be designed within the same chamber assembly, as shown. Alternatively, upper electrode 1970 may comprise a multi-zone electrode design for adjusting the RF power distribution coupled to plasma above substrate 1925. For example, the upper electrode 1970 may be segmented into a center electrode and an edge electrode.

Depending on the applications, additional devices such as sensors or metrology devices can be coupled to the processing chamber 1910 and to the controller 1955 to collect real time data and use such real time data to concurrently control two or more selected integration operating variables in two or more steps involving deposition processes, RIE processes, pull processes, pattern reformation processes, heating treatment processes and/or pattern transfer processes of the integration scheme. Furthermore, the same data can be used to ensure integration targets including completion of post heat treatment (PHT), patterning uniformity (uniformity), pulldown of patterned structure (pulldown), slimming of patterned structure (slimming), aspect ratio of patterned structure (aspect ratio), etch selectivity, line edge roughness (LER), line width roughness (LWR), substrate throughput, cost of ownership, and the like are achieved.

Although only certain embodiments of this invention have been described in detail above, those skilled in the art will readily appreciate that many modifications are possible in the embodiments without materially departing from the novel teachings and advantages of this invention. Although the DCS embodiment is used to explain the principles, features, and benefits of the present invention, as mentioned above, the invention can be used for substrates with other structure pattern layers that can include two or more materials. Accordingly, all such modifications are intended to be included within the scope of this invention.

What we claim:

1. A method of patterning spacers in a multi-patterning scheme, the method comprising:
   providing an initial patterned structure on a substrate in a processing chamber, the initial patterned structure comprising an organic mandrel and an underlying layer;
   exposing the initial patterned structure in a direct current superposition (DCS) plasma treatment process, the DCS plasma treatment process depositing a layer of a first material on the initial patterned structure configured to protect the initial patterned structure during subsequent operations;
   performing an atomic layer conformal deposition process to deposit a second material, the first material providing protection to the organic mandrel at the beginning of the atomic layer conformal deposition process;
   performing a spacer etch mandrel pull (SEMP) process, the SEMP process creating a final patterned structure with a target final sidewall angle;
   concurrently controlling integration operating variables in the DCS plasma treatment process, the atomic layer conformal deposition process, and the SEMP process in order to meet integration objectives including the target final sidewall angle.

2. The method of claim 1 wherein the target final sidewall angle is in a range from 89 to 90 degrees, the first material is silicon and the second material is silicon oxide.

3. The method of claim 2 wherein the silicon is from a top electrode in a DCS plasma treatment device used in the DCS plasma treatment process, the silicon forming an atomic layer deposition protecting the top and sides of the initial patterned structure by forming a silicon oxide layer.

4. The method of claim 2 wherein the integration operating variables for the DCS plasma treatment process include the DCS voltage, H2 flowrate, Ar flowrate, process time, temperature, pressure, and high frequency power.

5. The method of claim 4 wherein the DCS voltage is in a range from 700 to 1100 V.

6. The method of claim 4 wherein the H2 flowrate is in the range from 80 to 119 sccm and/or the Ar flowrate is in the range from 80 to 119 sccm.

7. The method of claim 4 wherein the process time is in a range from 10 to 30 seconds.

8. The method of claim 4 wherein the temperature is in the range from 10 to 50 degrees C.

9. The method of claim 4 wherein the pressure is in the range from 80 to 100 mT and the high frequency power is in the range from 80 to 119 MHz.

10. The method of claim 4, further comprising, prior to providing the initial patterned structure:
    providing a resist layer, an intermediate layer, an organic layer, and the underlying layer; and
    performing an organic open process to etch the intermediate layer and the organic layer, remove the resist layer, and remove the intermediate layer to thereby generate the initial patterned structure.

11. The method of claim 10 wherein the intermediate layer includes a silicon anti-reflective coating (SiARC), and the organic layer comprises one of an organic planarizing layer (OPL), an advanced pattern film (APF), or a spin-on hardmask (SOH).

12. The method of claim 11 wherein the APF includes chemical vapor deposition (CVD) amorphous carbon film containing hydrogen, the SOH includes spin-on organic polymer carbon content greater than 90%, and the OPL comprises a composition of C/H/O/N 81.6/4.6/9.9/3.9 wt % or C/H/O/N 85.4/5.8/6.0/2.9 wt %.

13. The method of claim 1 wherein the integration objectives include the target final sidewall angle in a range from 87 to 90 degrees.

14. The method of claim 1 wherein the integration objectives include a target line width roughness (LWR) of the final patterned structure in a range from 4.0 to 4.8 nm after the SEMP process.

15. The method of claim 1 wherein the integration objectives include a target line width roughness (LWR) of the final patterned structure in a range from 3.5 to 4.0 nm after the atomic layer conformal deposition process.

16. The method of claim 1 wherein the integration objectives include a target left-line edge roughness (L-LER) of the final patterned structure in a range from 2.2 to 2.8 nm after the SEMP process.

17. The method of claim 1 wherein the integration objectives include a target left-line edge roughness (L-LER) of the final patterned structure in a range from 2.2 to 3.0 nm after the atomic layer conformal deposition process.

18. The method of claim 1:
    wherein the integration objectives include a target edge placement error of the final patterned structure in a range from 0.1 to 3.0% or a range from −0.1 to −3.0%; and
    wherein the integration operating variables are controlled to meet the target edge placement error.

19. The method of claim 1 wherein concurrently controlling integration operating variables in order to meet integration objectives includes:
    performing measurements of integration operating variables; and
    performing adjustments of one of more of the integration operating variables in order to meet the integration objectives; or
    performing in situ online measurements of integration operating variables; and
    performing in situ adjustments of one of more of the integration operating variables in order to meet the integration objectives, wherein the in situ adjustments are based on the in situ online measurements of the integration operating variables.

20. The method of claim 4 wherein the process time is in a range from 31 to 60 seconds.

* * * * *

UNITED STATES PATENT AND TRADEMARK OFFICE
CERTIFICATE OF CORRECTION

PATENT NO. : 10,354,873 B2
APPLICATION NO. : 15/491432
DATED : July 16, 2019
INVENTOR(S) : Akiteru Ko et al.

Page 1 of 2

It is certified that error appears in the above-identified patent and that said Letters Patent is hereby corrected as shown below:

In the Specification

Column 1, Lines 10-11, change "which is expressly incorporated by reference" to --which are expressly incorporated by reference--.

Column 7, Line 21, change "spacers 538 that gets amplified as the substrate 532 undergo" to --spacers 538 that gets amplified as the substrate 532 undergoes--.

Column 7, Lines 63-64, change "670 illustrating how the patterned structure 676 on the substrate 674 are trapezoidal in" to --670 illustrating how the patterned structure 676 on the substrate 674 is trapezoidal in--.

Column 7, Line 67, change "688 leaning in a pairs of trapezoidal shapes, 688 and 672," to --688 leaning in a pair of trapezoidal shapes, 688 and 672,--.

Column 10, Line 4, change "side-view image 1430 of the substrate 1450 post SEMI'" to --side-view image 1430 of the substrate 1450 post SEMP--.

Column 10, Lines 33-34, change "where DCS was performed using a third set of operating parameters for Blade 3 1604 comprising with 100 mT, 20 s," to --where DCS was performed using a third set of operating parameters for Blade 3 1604 comprising 100 mT, 20 s,--.

Column 11, Line 35, change "L-LER can in a range from 2.2 to 3.0 nm." to --L-LER can be in a range from 2.2 to 3.0 nm.--.

Column 11, Line 43, change "4.0 to 4.8 nm and the L-LER can in a range from 2.0 to 2.8" to --4.0 to 4.8 and the L-LER can be in a range from 2.0 to 2.8--.

Column 11, Lines 61-62, change "Other combination of integration objectives may also be used" to --Other combinations of integration objectives may also be used--.

Signed and Sealed this
Tenth Day of September, 2019

Andrei Iancu
*Director of the United States Patent and Trademark Office*

Column 14, Lines 4-5, change "The design and implementation of an upper electrode is well known to those" to --The design and implementation of an upper electrode are well known to those--.